United States Patent
Lin et al.

(10) Patent No.: US 6,756,295 B2
(45) Date of Patent: Jun. 29, 2004

(54) CHIP STRUCTURE AND PROCESS FOR FORMING THE SAME

(75) Inventors: Mou-Shiung Lin, Hsinchu (TW); Jin-Yuan Lee, Hsinchu (TW); Ching-Cheng Huang, Hsinchu (TW)

(73) Assignee: Megic Corporation, Hsinchu (TW)

( * ) Notice: Subject to any disclaimer, the term of this patent is extended or adjusted under 35 U.S.C. 154(b) by 0 days.

(21) Appl. No.: 10/124,388

(22) Filed: Apr. 15, 2002

(65) Prior Publication Data

US 2002/0109232 A1 Aug. 15, 2002

Related U.S. Application Data

(63) Continuation-in-part of application No. 09/216,791, filed on Dec. 21, 1998, now abandoned, and a continuation-in-part of application No. 09/251,183, filed on Feb. 17, 1999, now Pat. No. 6,383,916, and a continuation-in-part of application No. 09/691,497, filed on Oct. 18, 2000, now Pat. No. 6,495,442, and a continuation-in-part of application No. 09/972,639, filed on Oct. 9, 2001, now Pat. No. 6,657,310.

(30) Foreign Application Priority Data

Dec. 13, 2001 (TW) .................................. 90130876 A
Dec. 14, 2001 (TW) .................................. 90131030 A
Dec. 21, 2001 (TW) .................................. 90131796 A

(51) Int. Cl.$^7$ ............................................. H01L 21/44
(52) U.S. Cl. ...................... 438/612; 438/622; 438/623; 438/637
(58) Field of Search .......................... 438/22, 26, 48, 438/106, 107, 110, 238, 239, 253–256, 381, 382, 396–399, 611–614, 622–625, 637; 257/698, 700–703, 723, 724, 758, 759, 774, 920, 924

(56) References Cited

U.S. PATENT DOCUMENTS

| | | | | |
|---|---|---|---|---|
| 5,357,403 A | * | 10/1994 | Haller et al. | 361/794 |
| 5,434,751 A | * | 7/1995 | Cole et al. | 361/792 |
| 5,635,767 A | * | 6/1997 | Wenzel et al. | 257/778 |
| 6,303,423 B1 | * | 10/2001 | Lin | 438/238 |

* cited by examiner

Primary Examiner—Alonzo Chambliss
(74) Attorney, Agent, or Firm—J.C. Patents

(57) ABSTRACT

A chip structure comprises a substrate, a first built-up layer, a passivation layer and a second built-up layer. The substrate includes many electric devices placed on a surface of the substrate. The first built-up layer is located on the substrate. The first built-up layer is provided with a first dielectric body and a first interconnection scheme, wherein the first interconnection scheme interlaces inside the first dielectric body and is electrically connected to the electric devices. The first interconnection scheme is constructed from first metal layers and plugs, wherein the neighboring first metal layers are electrically connected through the plugs. The passivation layer is disposed on the first built-up layer and is provided with openings exposing the first interconnection scheme. The second built-up layer is formed on the passivation layer. The second built-up layer is provided with a second dielectric body and a second interconnection scheme, wherein the second interconnection scheme interlaces inside the second dielectric body and is electrically connected to the first interconnection scheme. The second interconnection scheme is constructed from at least one second metal layer and at least one via metal filler, wherein the second metal layer is electrically connected to the via metal filler. The thickness, width, and cross-sectional area of the traces of the second metal layer are respectively larger than those of the first metal layers.

35 Claims, 11 Drawing Sheets

CHIP STRUCTURE AND PROCESS FOR FORMING THE SAME

CROSS-REFERENCE TO RELATED APPLICATION

The present application is a continuation-in-part of patent application Ser. No. 09/216,791, filed Dec. 21, 1998, now abandoned, by M. S. Lin. The present application is a continuation-in-part of patent application Ser. No. 09/251,183, filed Feb. 17, 1999, now U.S. Pat. No. 6,383,916, by M. S. Lin. The present application is a continuation-in-part of patent application Ser. No. 09/691,497, filed Oct. 18, 2000, now U.S. Pat. No. 6,495,442, by M. S. Lin and J. Y. Lee. The present application is a continuation-in-part of patent application Ser. No. 09/972,639, filed Oct. 9, 2001, now U.S. Pat. No. 6,657,310, by M. S. Lin. All disclosures of these prior applications are incorporated herein by reference.

BACKGROUND OF THE INVENTION

1. Field of the Invention

The invention relates in general to a chip structure and a process for forming the same. More particularly, the invention relates to a chip structure for improving the resistance-capacitance delay and a forming process thereof.

2. Description of the Related Art

Nowadays, electronic equipment are increasingly used to achieve many various tasks. With the development of electronics technology, miniaturization, multi-function task, and comfort of utilization are among the principle guidelines of electronic product manufacturers. More particularly in semiconductor manufacture process, the semiconductor devices with 0.18 microns have been mass-produced. However, the relatively fine interconnections therein negatively impact the chip. For example, this causes the voltage drop of the buses, the resistance-capacitor delay of the key traces, and noises, etc.

FIG. 1 is a cross-sectional view showing a conventional chip structure with interconnections.

As shown in FIG. 1, a chip structure 100 is provided with a substrate 110, an built-up layer 120 and a passivation layer 130. There are plenty of electric devices 114, such as transistors, on a surface 112 of the substrate 110, wherein the substrate 110 is made of, for example, silicon. The built-up layer 120 provided with a dielectric body 122 and an interconnection scheme 124 is formed on the surface 112 of the substrate 110. The interconnection scheme 124 interlaces inside the dielectric body 122 and is electrically connected to the electric devices 114. Further, the interconnection scheme 124 includes many conductive pads 126 exposed outside the dielectric body 122 and the interconnection scheme 124 can electrically connect with external circuits through the conductive pads 126. The dielectric body 122 is made of, for instance, silicon nitride or silicon oxide. In addition, the passivation layer 130 is deposited on the built-up layer 120, and has many openings respectively exposing the conductive pads 126. The interconnection scheme 124 includes at least one metal layer that can serve as a power bus or a ground bus. The power bus or the ground bus is connected to at least one of the conductive pads 126 through which the power bus or the ground bus can electrically connect with external circuits.

However, as far as the chip structure 100 is concerned, resistance-capacitance (RC) delay is easily generated because the line width of the interconnection scheme 124 is extremely fine, about below 0.3 microns, the thickness of the interconnection scheme 124 is extremely thin, and the dielectric constant of the dielectric body 122 is extremely high, about 4. Therefore, the chip efficiency drops off. In particular, the RC delay even usually occurs with respect to a power bus, a ground bus or other metal lines transmitting common signals. In addition, the production of the interconnection scheme 124 with extremely fine line width is necessarily performed using facilities with high accuracy. This causes production costs to dramatically rise.

The present invention is related to a R.O.C. patent application Ser. No. 88120548, filed Nov. 25, 1999, by M. S. Lin, issued Sep. 1, 2001, now R.O.C. Pat. No. 140721. R.O.C. patent application Ser. No. 88120548 claims the priority of pending U.S. patent application Ser. No. 09/251,183 and the subject matter thereof is disclosed in pending U.S. patent application Ser. No. 09/251,183. The present invention is related to a R.O.C. patent application Ser. No. 90100176, filed Jan. 4, 2001, by M. S. Lin and J. Y. Lee, now pending. The subject matter of R.O.C. patent application Ser. No. 90100176 is disclosed in pending U.S. patent application Ser. No. 09/691,497. The present invention is related to a Japanese patent application Ser. No. 200156759, filed Mar. 1, 2001, by M. S. Lin and J. Y. Lee, now pending. The present invention is related to a European patent application Ser. No. 01480077.5, filed Aug. 27, 2001, by M. S. Lin and J. Y. Lee, now pending. The present invention is related to a Singaporean patent application Ser. No. 200101847-2, filed Mar. 23, 2001, by M. S. Lin and J. Y. Lee, now pending. Japanese patent application Ser. No. 200156759, European patent application Ser. No. 01480077.5, and Singaporean patent application Ser. No. 200101847-2 claim the priority of pending U.S. patent application Ser. No. 09/691,497 and the subject matter of them is disclosed in pending U.S. patent application Ser. No. 09/691,497.

SUMMARY OF THE INVENTION

Accordingly, an objective of the present invention is to provide a chip structure and a process for forming the same that improves resistance-capacitance delay and reduces energy loss of the chip.

Another objective of the present invention is to provide a chip structure and a process for forming the same that can be produced using facilities with low accuracy. Therefore, production costs can substantially reduce.

To achieve the foregoing and other objectives, the present invention provides a chip structure that comprises a substrate, a first built-up layer, a passivation layer and a second built-up layer. The substrate includes many electric devices placed on a surface of the substrate. The first built-up layer is located on the substrate. The first built-up layer is provided with a first dielectric body and a first interconnection scheme, wherein the first interconnection scheme interlaces inside the first dielectric body and is electrically connected to the electric devices. The first interconnection scheme is constructed from first metal layers and plugs, wherein the neighboring first metal layers are electrically connected through the plugs. The passivation layer is disposed on the first built-up layer and is provided with openings exposing the first interconnection scheme. The second built-up layer is formed on the passivation layer. The second built-up layer is provided with a second dielectric body and a second interconnection scheme, wherein the second interconnection scheme interlaces inside the second dielectric body and is electrically connected to the first interconnection scheme. The second interconnection scheme is constructed from at least one second metal layer and at least one via metal filler, wherein the second metal layer is electrically connected to the via metal filler. The thickness, width, and cross-sectional area of the traces of the second metal layer are respectively larger than those of the first metal layers. In addition, the first dielectric body is constructed from at least one first dielectric layer, and the second dielectric body is constructed from at least one second dielectric layer. The individual second dielectric layer is thicker than the individual first dielectric layer.

According to a preferred embodiment of the present invention, the thickness of the traces of the second metal layer ranges from 1 micron to 50 microns; the width of the traces of the second metal layer ranges from 1 micron to 1 centimeter; the cross sectional area of the traces of the second metal layer ranges from 1 square micron to 0.5 square millimeters. The first dielectric body is made of, for example, an inorganic compound, such as a silicon nitride compound or a silicon oxide compound. The second dielectric body is made of, for example, an organic compound, such as polyimide (PI), benzocyclobutene (BCB), porous dielectric material, or elastomer. In addition, the above chip structure further includes at least one electrostatic discharge (ESD) circuit and at least one transitional device that are electrically connected to the first interconnection scheme. The transitional device can be a driver, a receiver or an I/O circuit. Moreover, the first interconnection scheme include at least one first conductive pad, at least one second conductive pad, and at least one linking trace, wherein the openings of the passivation layer expose the first conductive pad and the second conductive pad. The second conductive pad is electrically connected to the second interconnection scheme. The first conductive pad is exposed to the outside. The linking trace connects the first conductive pad with the second conductive pad and is shorter than 5,000 microns.

To sum up, the chip structure of the present invention can decline the resistance-capacitance delay, the power of the chip, and the temperature generated by the driving chip since the cross sectional area, the width and the thickness of the traces of the second metal layer are extremely large, since the cross sectional area of the via metal filler is also extremely large, since the second interconnection scheme can be made of low-resistance material, such as copper or gold, since the thickness of the individual second dielectric layer is also extremely large, and since the second dielectric body can be made of organic material, the dielectric constant of which is very low, approximately between 1~3, the practical value depending on the applied organic material.

In addition, the chip structure of the present invention can simplify a design of a substrate board due to the node layout redistribution, fitting the design of the substrate board, of the chip structure by the second interconnection scheme and, besides, the application of the fewer nodes to which ground voltage or power voltage is applied. Moreover, in case the node layout redistribution of various chips by the second interconnection scheme causes the above various chips to be provided with the same node layout, the node layout, matching the same node layout of the above various chips, of the substrate board can be standardized. Therefore, the cost of fabricating the substrate board substantially drops off.

Moreover, according to the chip structure of the present invention, the second interconnection scheme can be produced using facilities with low accuracy. Therefore, production costs of the chip structure can substantially be reduced.

To achieve the foregoing and other objectives, the present invention provides a process for making the above chip structure. The process for fabricating a chip structure comprises the following steps.

Step 1: A wafer is provided with a plurality of electric devices, an interconnection scheme and a passivation layer. Both the electric devices and the interconnection scheme are arranged inside the wafer. The interconnection scheme is electrically connected with the electric devices. The passivation layer is disposed on a surface layer of the wafer. The passivation layer has at least one opening exposing the interconnection scheme. The largest width of the opening of the passivation ranges from 0.5 microns to 200 microns Step 2: A conductive layer is formed over the passivation layer of the wafer by, for example, a sputtering process, and the conductive layer is electrically connected with the interconnection scheme.

Step 3: A photoresist is formed onto the conductive layer, and the photoresist has at least one opening exposing the conductive layer.

Step 4: At least one conductive metal is filled into the opening of the photoresist by, for example, a electroplating process, and the conductive metal is disposed over the conductive layer.

Step 5: The photoresist is removed.

Step 6: The conductive layer exposed to the outside is removed by, for example, an etching process, and the conductive layer deposited under the conductive metal remains. A signal is transmitted from one of the electric devices to the interconnection scheme, then passes through the passivation layer, and finally is transmitted to the conductive metal, and further, the signal is transmitted from the conductive metal to the interconnection scheme with passing through the passivation layer, and finally is transmitted to the other one or more of the electric devices.

Provided that two metal layers are to be formed, the process for fabricating the above chip structure further comprises the following steps:

Step 7: A dielectric sub-layer is formed over the passivation layer and covers the formed conductive metal. The dielectric sub-layer has at least one opening exposing the conductive metal formed at a lower portion.

Step 8: At least other one conductive layer is formed on the dielectric sub-layer and into the opening of the dielectric sub-layer by, for example, a sputtering process. The other conductive layer is electrically connected with the metal layer exposed by the opening of the dielectric sub-layer.

Step 9: A photoresist is formed onto the other conductive layer, and the photoresist having at least one opening exposing the other conductive layer.

Step 10: At least other one conductive metal is filled into the opening of the photoresist by, for example, an electroplating process, and the other conductive metal disposed over the other conductive layer.

Step 11: The photoresist is removed.

Step 12: The other conductive layer exposed to the outside is removed by, for example, an etching process, and the other conductive layer deposited under the other conductive metal remains.

Provided that multiple metal layers are to be formed, the sequential steps 7–12 are repeated at least one time.

To achieve the foregoing and other objectives, the present invention provides another process for making the above chip structure. The process for fabricating a chip structure comprises the following steps.

Step 1: A wafer is provided with a plurality of electric devices, an interconnection scheme and a passivation layer.

Both the electric devices and the interconnection scheme are arranged inside the wafer. The interconnection scheme is electrically connected with the electric devices. The passivation layer is disposed on a surface layer of the wafer. The passivation layer has at least one opening exposing the interconnection scheme.

Step 2: At least one conductive metal is formed over the passivation layer of the wafer by, for example, a sputtering process, and the conductive metal is electrically connected with the interconnection scheme.

Step 3: A photoresist is formed onto the conductive metal, and the photoresist is patterned to expose the conductive metal to the outside.

Step 4: The conductive metal exposed to the outside is removed, and the conductive metal deposited under the photoresist remains.

Step 5: The photoresist is removed.

Provided that two metal layers are to be formed, the process for fabricating the above chip structure further comprises the following steps:

Step 6: A dielectric sub-layer is formed over the passivation layer and covers the formed conductive metal. The dielectric sub-layer has at least one opening exposing the conductive metal formed at a lower portion.

Step 7: At least other one conductive metal is formed over the passivation layer of the wafer by, for example, a sputtering process, and the other conductive metal electrically is connected with the conductive metal formed at a lower portion.

Step 8: A photoresist is formed onto the other conductive metal, and the photoresist is patterned to expose the other conductive metal to the outside.

Step 9: The other conductive metal exposed to the outside is removed, and the other conductive metal deposited under the photoresist remains.

Step 10: The photoresist is removed.

Provided that multiple metal layers are to be formed, the sequential steps 6–10 are repeated at least one time.

Both the foregoing general description and the following detailed description are exemplary and explanatory only and are not restrictive of the invention, as claimed. It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. A simple description of the drawings is as follows.

DESCRIPTION OF THE PREFERRED EMBODIMENTS

Prior to describing the embodiment of the invention, the factors of the resistance-capacitance delay and those of the power loss will be introduced as the following equations.

$$\tau = RC = 2\epsilon \rho L[L/(T_{u.d.}T_m) + L/(WS)]$$

$$P \propto 2\pi f V^2 k \epsilon (\tan \delta)$$

where $\tau$ is effect of resistance-capacitance delay; P is power loss; $\epsilon$ is dielectric constant of dielectric material; $\rho$ is resistance of traces; L is trace length; W is trace width; S is pitch between traces; $T_{u.d.}$ is thickness of dielectric material; $T_m$ is trace thickness; tan $\delta$ is dielectric loss; V is applied voltage; f is frequency; k is factor of capacitor structure.

According to the above equation, the factors of the resistance-capacitance delay and those of the power loss can be known. Therefore, an increase in thickness of every dielectric layer, an application of dielectric material with low dielectric constant, an application of traces with low resistance, or an increase in width or thickness of traces leads an effect of a resistance-capacitance delay and a power loss of a chip to decline.

Figure 1:
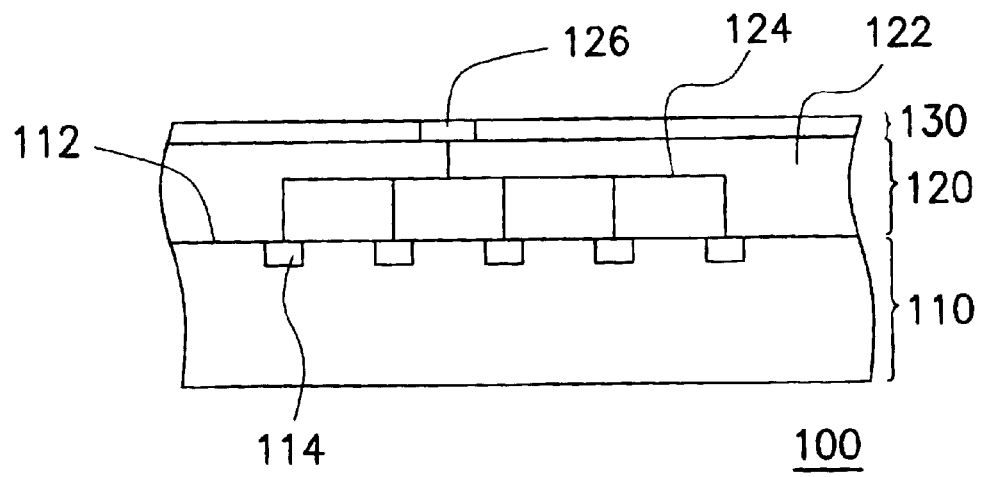
FIG. 1 is a cross-sectional view schematically showing a conventional chip structure with interconnections.
Figure 2:
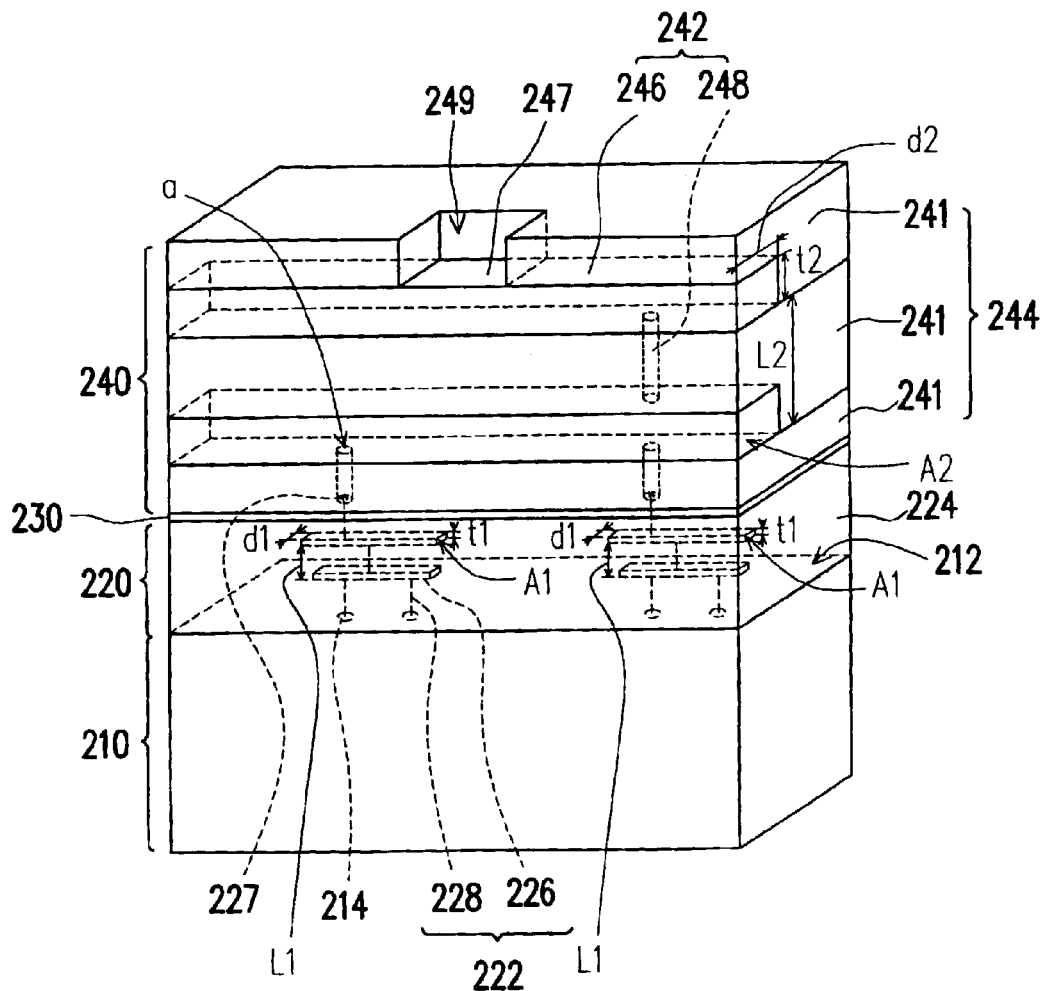
FIG. 2 is a cross-sectional view schematically showing a chip structure according to a first embodiment of the present invention.

According to the above conception, the present invention provides various improved chip structure. Please refer to FIG. 2, a cross-sectional view schematically showing a chip structure according to a first embodiment of the present invention. A chip structure 200 is provided with a substrate 210, a first built-up layer 220, a passivation layer 230 and a second built-up layer 240. There are plenty of electric devices 214, such as transistors, on a surface 212 of the substrate 210, wherein the substrate 210 is made of, for example, silicon. The first built-up layer 220 is located on the substrate 210. The first built-up layer 220 is formed by cross lamination of first metal multi-layers 226 and first dielectric multi-layers. Moreover, plugs 228 connect the upper first metal layers 226 with the lower first metal layers 226 or connect the first metal layers 226 with the electric devices 214. The first metal multi-layers 226 and the plugs 228 compose a first interconnection scheme 222. The first dielectric multi-layers compose a first dielectric body 224. The first interconnection scheme 222 interlaces inside the first dielectric body 224 and is electrically connected to the electric devices 214. The first interconnection scheme 222 includes plenty of conductive pads 227 (only shows one of them) that are exposed outside the first dielectric body 224. The first interconnection scheme 222 can electrically connect with other circuits through the conductive pads 227. The first dielectric body 224 is made of, for example, an inorganic compound, such as a silicon oxide compound or a silicon nitride compound. The material of the first interconnection scheme 222 includes, for example, copper, aluminum or tungsten. Provided that the first interconnection scheme 222 is formed by a copper process, the first metal layers 226 and the plugs 228 are made of copper. Provided that the first interconnection scheme 222 is formed by a general process, the first metal layers 226 are made of aluminum and the plugs 228 are made of tungsten.

The passivation layer 230 is disposed on the first built-up layer 220 and is provided with openings exposing the conductive pads 227. The passivation layer 230 is contructed of, for example, an inorganic compound, such as a silicon oxide compound, a silicon nitride compound, phosphosilicate glass (PSG), a silicon oxide nitride compound or a composite formed by laminating the above material.

The second built-up layer 240 is formed on the passivation layer 230. The second built-up layer 240 is formed by cross lamination of second metal multi-layers 246 and second dielectric multi-layers 241. Moreover, via metal fillers 248 connect the upper second metal layers 246 with the lower second metal layers 246 or connect the second metal layers 246 with the conductive pads 227. The second metal layers 246 and the via metal fillers 248 compose a second interconnection scheme 242. The second dielectric multi-layers 241 compose a second dielectric body 244. The second interconnection scheme 242 interlaces inside the second dielectric body 244 and is electrically connected to the conductive pads 227. The second interconnection scheme 242 includes plenty of nodes 247 (only shows one of them). The second dielectric body 244 is provided with openings 249 exposing the nodes 247 of the second interconnection scheme 242. The second interconnection scheme 242 can electrically connect with external circuits through the nodes 247. The second dielectric body 244 is made of, for example, an organic compound, such as polyimide (PI), benzocyclobutene (BCB), porous dielectric material, parylene, elastomer, or other macromolecule polymers. The material of the second interconnection scheme 242 includes, for example, copper, aluminum, gold, nickel, titanium-tungsten, titanium or chromium. Because mobile ions and moisture of the second built-up layer 240 can be prevented by the passivation layer 230 from penetrating into the first built-up layer 220 or the electric devices 214, it is practicable that an organic compound and various metals are formed over the passivationtion layer 230. The cross-sectional area A2 of the traces of the second metal layers 246 is extremely larger than the cross-sectional area A1 of the traces of the first metal layers 226 and than the cross-sectional area of the plugs 228. The cross-sectional area a of the via metal fillers 248 is extremely larger than the cross-sectional area A1 of the traces of the first metal layers 226 and than the cross-sectional area of the plugs 228. The trace width d2 of the second metal layers 246 is extremely larger than the trace width d1 of the first metal layers 226. The trace thickness t2 of the second metal layers 246 is extremely larger than the trace thickness t1 of the first metal layers 226. The thickness L2 of the individual second dielectric layers 241 is extremely larger than the thickness L1 of the individual first dielectric layers of the first built-up layers 220. The cross-sectional area a of the via metal fillers 248 is extremely larger than the area, exposed outside the passivation layer 230, of the conductive pads 227. The trace width d2 of the second metal layers 246 is larger than 1 micron, and preferably ranges from 1 micron to 1 centimeter. The trace thickness t2 of the second metal layers 246 is larger than 1 micron, and preferably ranges from 1 micron to 50 microns. The cross-sectional area A2 of the second metal layers 246 is larger than 1 square micron, and preferably ranges from 1 square micron to 0.5 square millimeters. The cross-sectional area a of the via metal fillers 248 is larger than 1 square micron, and preferably ranges from 1 square micron to 10,000 square microns. The thickness L2 of the individual second dielectric layers 241 is larger than 1 micron, and preferably ranges from 1 micron to 100 microns.

The above chip structure can decline the resistance-capacitance delay, the power of the chip, and the temperature generated by the driving chip since the cross sectional area, the width and the thickness of the traces of the second metal layers 246 are extremely large, since the cross sectional area of the via metal fillers 248 is also extremely large, since the second interconnection scheme 242 can be made of low-resistance material, such as copper or gold, since the thickness L2 of the individual second dielectric layers 241 is also extremely large, and since the second dielectric body 244 can be made of organic material, the dielectric constant of which is very low, approximately between 1~3, the practical value depending on the applied organic material.

According to the above chip structure, the traces of the second interconnection scheme 242 are extremely wide and thick and the cross-sectional area of the via metal fillers 248 is extremely large. Thus, the second interconnection scheme 242 can be formed by low-cost fabricating processes, such as an electroplating process, an electroless plating process, or a sputtering process, and, moreover, the second interconnection scheme 242 can be produced using facilities with low accuracy. Therefore, the production costs of the chip structure can be substantially saved. In addition, the request for the clean room where the second built-up layer is formed is not high, ranging from Class 10 to Class 100. Consequently, the construction cost of the clean room can be conserved.

The chip structure can simplify a design of a substrate board due to the layout redistribution, fitting the design of the substrate board, of the nodes 247 of the chip structure by the second interconnection scheme 242 and, besides, the application of the fewer nodes 247 to which ground voltage or power voltage is applied. Moreover, in case the layout redistribution of nodes 247 of various chips by the second interconnection scheme 242 causes the above various chips to be provided with the same node layout, the node layout, matching the same node layout of the above various chips, of the substrate board can be standardized. Therefore, the cost of fabricating the substrate board substantially drops off.

Figure 3:
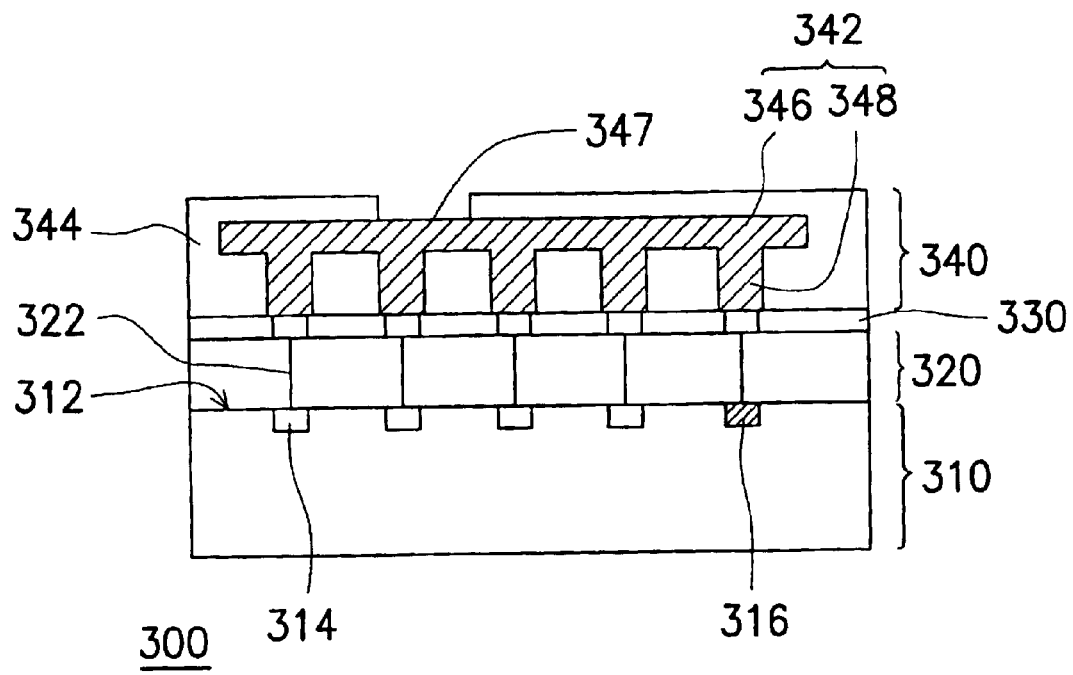
FIG. 3 is a cross-sectional view schematically showing a chip structure according to a second embodiment of the present invention.

Next, other preferred embodiments of the present invention will be introduced. As a lot of electric devices are electrically connected with a power bus and a ground bus, the current through the power bus and the ground bus is relatively large. Therefore, the second interconnection scheme of the second built-up layer can be designed as a power bus or a ground bus, as shown in FIG. 3. FIG. 3 is a cross-sectional view schematically showing a chip structure according to a second embodiment of the present invention. The first interconnection scheme 322 of the built-up layer 320 electrically connects the second interconnection scheme 342 of the built-up layer 340 with the electric devices 314 and at least one electrostatic discharge circuit 316, wherein the electrostatic discharge circuit 316 is disposed on the surface 312 of the substrate 310. As a result, provided that the second interconnection scheme 342 is designed as a power bus, the second interconnection scheme 342 electrically connects with the power ends of the electric devices 314. Provided that the second interconnection scheme 342 is designed as a ground bus, the second interconnection scheme 342 electrically connects with the ground ends of the electric devices 314. The second metal layer 346 of the power bus or that of the ground bus can be of, for example, a planer type. According to the above chip structure, each of the power buses or the ground buses can electrically connect with more electric devices 314 than that of prior art. Consequently, the number of the power buses or the ground buses can be reduced and, also, the number of the electrostatic discharge circuits 316 accompanying the power buses or the ground buses can be reduced. In addition, the number of the nodes 347 accompanying the power buses or the ground buses can be reduced. Thus, the circuit layout can be simplified and the production cost of the chip structure 300 can be saved. The electrostatic discharge circuits 316 can prevent the electric devices 314 electrically connected with the second interconnection scheme 344 from being damaged by the sudden discharge of high voltage. In addition, the chip structure 300 can be electrically connected with external circuits through the nodes 347 applying a flip-chip type, a wire-bonding type or a tape-automated-bonding type.

Figure 4:
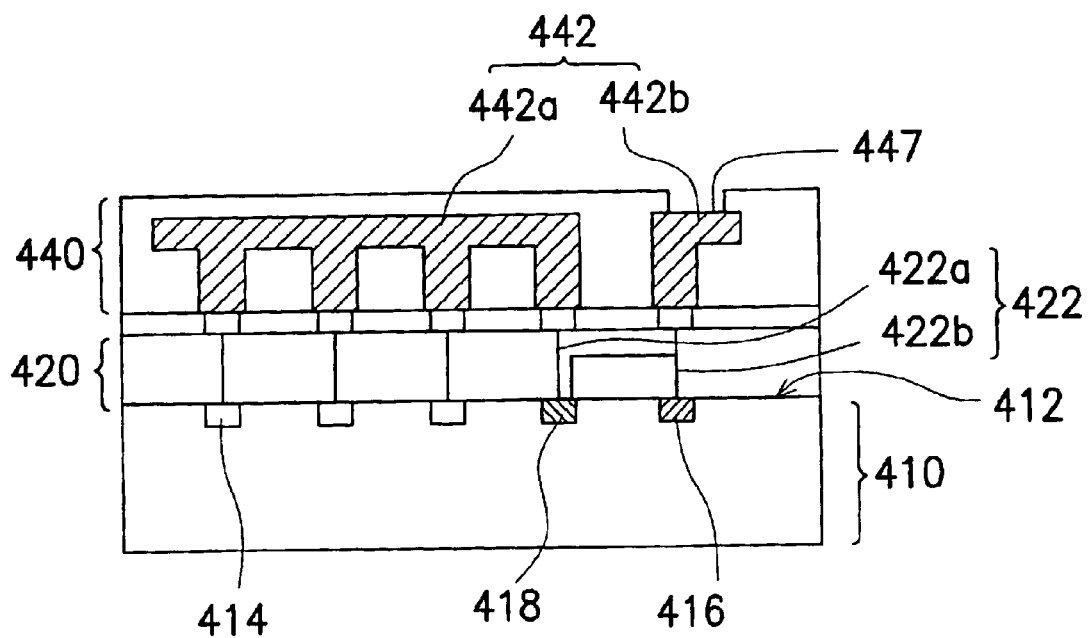
FIG. 4 is a cross-sectional view schematically showing a chip structure according to a third embodiment of the present invention.

Referring to FIG. 4, FIG. 4 is a cross-sectional view schematically showing a chip structure according to a third embodiment of the present invention. There are many electric devices 414, many electrostatic discharge circuits 416 (only shows one of them) and many transition devices 418 (only shows one of them) on the surface 412 of the substrate 410. The first interconnection scheme 422 is divided into first interconnections 422a and first transition interconnections 422b. The second interconnection scheme 442 is divided into second interconnections 442a and second transition interconnections 442b. Consequently, the nodes 447 are electrically connected with the transition devices 418 and the electrostatic discharge circuits 416 through the first transition interconnections 422b and the second transition interconnections 442b. The transition devices 418 are electrically connected with the electric devices 414 through the first interconnections 422a and the second interconnections 442a. For example, this circuit layout can be to transmit clock signals. The electrostatic discharge circuits 416 can prevent the electric devices 414 and the transition devices 418 from being damaged by the sudden discharge of high voltage. In addition, the chip structure can be electrically connected with external circuits through the nodes 447 applying a flip-chip type, a wire-bonding type or a tape-automated-bonding type.

Figure 5:
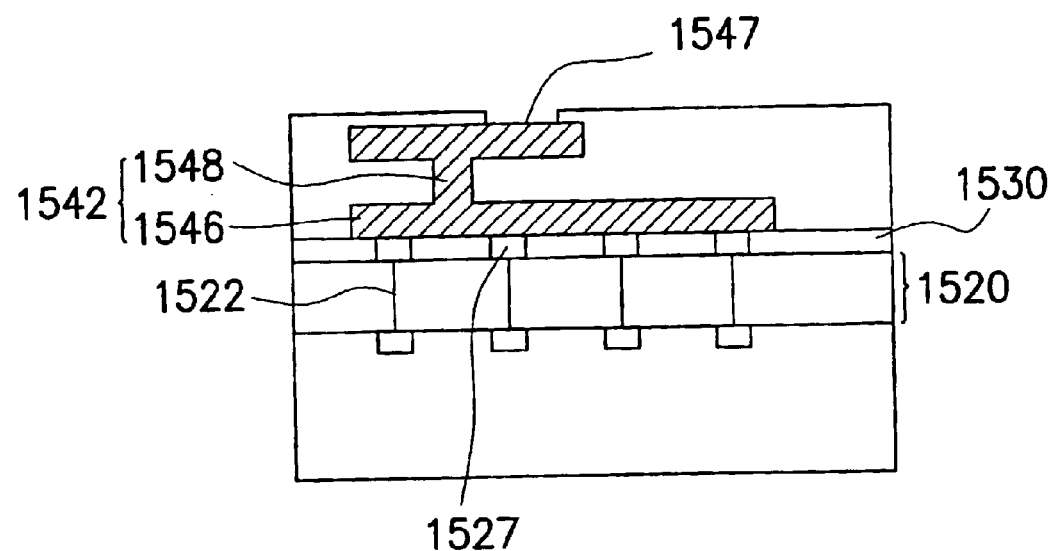
FIG. 5 is a cross-sectional view schematically showing a chip structure according to a forth embodiment of the present invention.

Referring to FIG. 5, FIG. 5 is a cross-sectional view schematically showing a chip structure according to a forth embodiment of the present invention. The second metal layer 1546 of the second interconnection scheme 1542 is directly formed on the passivation layer 1530. Thus, the second metal layer 1546 of the second interconnection scheme 1542 can be directly electrically connected with the conductive pads 1527, exposed outside the passivation layer 1530, of the first interconnection scheme 1522. In addition, the chip structure can be electrically connected with external circuits through the nodes 1547 applying a flip-chip type, a wire-bonding type or a tape-automated-bonding type.

Figure 6:
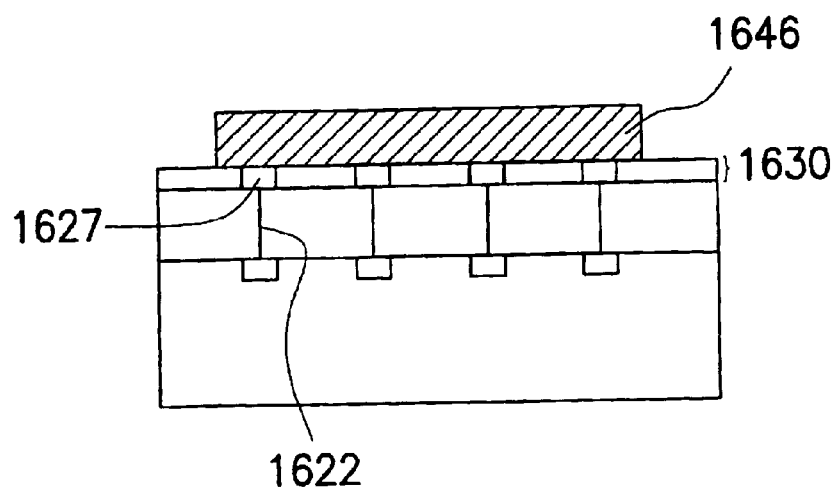
FIG. 6 is a cross-sectional view schematically showing a chip structure according to a fifth embodiment of the present invention.

According to the above embodiment, a second built-up layer is constructed from a second dielectric body and a second interconnection scheme. However, a second built-up layer also can be composed of only a second interconnection scheme, as shown in FIG. 6. FIG. 6 is a cross-sectional view schematically showing a chip structure according to a fifth embodiment of the present invention. The second metal layer 1646 of the second interconnection scheme is directly formed on the passivation layer 1630 and can be directly electrically connected with the conductive pads 1627, exposed outside the passivation layer 1630, of the first interconnection scheme 1622. The second metal layer 1646 is exposed to the outside. In addition, the chip structure can be electrically connected with external circuits by bonding wires onto the second metal layer 1646.

Figure 7:
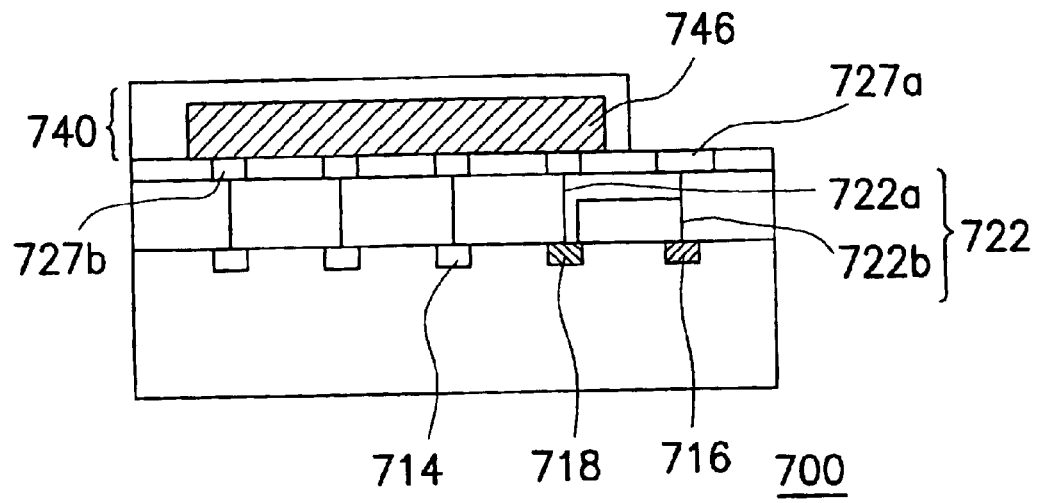
FIG. 7 is a cross-sectional view schematically showing a chip structure according to a sixth embodiment of the present invention.
Figure 8:
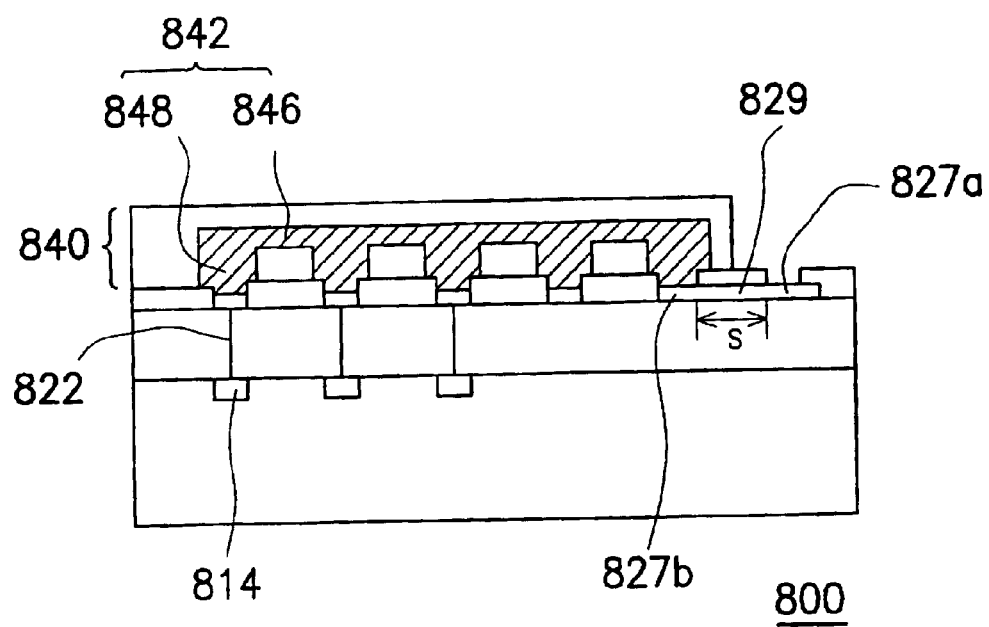
FIG. 8 is a cross-sectional view schematically showing a chip structure according to a seventh embodiment of the present invention.

According to the above chip structure, bumps or wires are directly electrically connected with the second interconnection layer. However, the application of the present invention is not limited to the above embodiment. Bumps or wires also can be directly connected with conductive pads and, besides, through the first interconnection scheme, the bumps or the wires can be electrically connected with the second interconnection scheme, as shown in FIG. 7 and FIG. 8. FIG. 7 is a cross-sectional view schematically showing a chip structure according to a sixth embodiment of the present invention. FIG. 8 is a cross-sectional view schematically showing a chip structure according to a seventh embodiment of the present invention.

Referring to FIG. 7, in the chip structure 700, the conductive pads 727a are exposed to the outside and the conductive pads 727b are directly electrically connected with the second metal layer 746. The chip structure 700 can be electrically connected with external circuits by bonding wires (not shown) onto the conductive pads 727a. Though the first transition interconnections 722b, the conductive pads 727a are electrically connected with the electrostatic discharge circuits 716 and the transition devices 718 respectively. Though the first interconnections 722a, the conductive pads 727b and the second metal layer 746, the transition devices 718 are electrically connected with the electric devices 714. In addition, bumps also can be formed on the conductive pads 727a, and the chip structure 700 can be electrically connected with external circuits through the bumps.

Referring to FIG. 8, in the chip structure 800, the conductive pads 827a are exposed to the outside and the conductive pads 827b are directly electrically connected with the second interconnection scheme 842. Linking traces 829 connect the conductive pads 827a with the conductive pads 827b. The chip structure 800 can be electrically connected with external circuits by bonding wires (not shown) onto the conductive pads 827a. Though the linking traces 829 and conductive pads 827b, the conductive pads 827a are electrically connected with the second interconnection scheme 842. Though the first interconnection scheme 822, the second interconnection scheme 842 is electrically connected with the electric devices 814. In addition, bumps (not shown) also can be formed on the conductive pads 827a, and the chip structure 800 can be electrically connected with external circuits through the bumps. The shorter the length S of the linking traces 829, the better the electrical efficiency of the chip structure 800. Otherwise, it is possible that the resistance-capacitance delay and the voltage drop will occur and the chip efficiency will be reduced. It is preferred that the length S of the linking traces 829 is less than 5,000 microns.

Following, the second built-up layer of the present invention will be described. FIGS. 9–15 are various cross-sectional views schematically showing a process of fabricating a chip structure according to an embodiment of the present invention.

Figure 9:
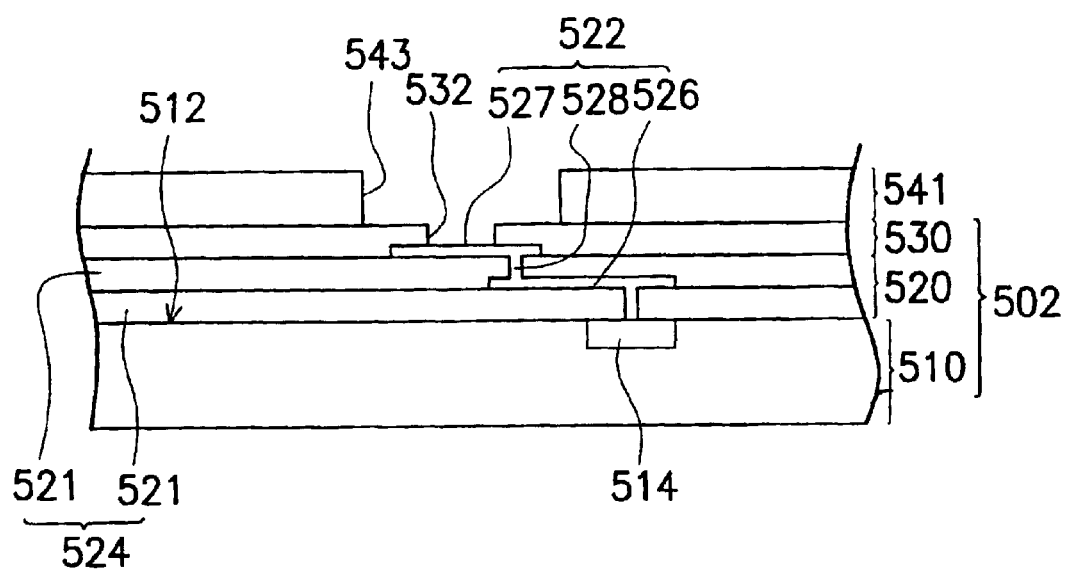
FIGS. 9–15 are various cross-sectional views schematically showing a process of fabricating a chip structure according to an embodiment of the present invention.

First, referring to FIG. 9, a wafer 502 is provided with a substrate 510, a first built-up layer 520 and a passivation layer 530. There are plenty of electric devices 514 on a surface 512 of the substrate 510. The first built-up layer 520 is formed on the substrate 510. The first built-up layer 520 includes a first interconnection scheme 522 and a first dielectric body 524, wherein the first interconnection scheme 522 interlaces inside the first dielectric body 524 and is electrically connected to the electric devices 514. The first dielectric body 524 is constructed from the lamination of first dielectric multi-layers 521. The first interconnection scheme 522 includes first metal multi-layers 526 and plugs 528. Through the plugs 528, the first metal layers 526 can be electrically connected with the electric devices 514 or the first metal layers 526 neighbored. The first interconnection scheme 522 further includes one or more conductive pads 527 (only shows one of them) that are exposed outside the first dielectric body 524. The passivation layer 530 is formed on the first built-up layer 520 and is provided with one or more openings 532 exposing the conductive pads 527. The largest width of the openings 532 ranges from 0.5 to 200 microns for example. Because the openings 532 can be formed relatively small, for example, the largest width of the openings 532 ranging from 0.5 to 20 microns, and, correspondingly, the conductive pads 527 can be formed relatively small, the routing density of the top metal layer having the conductive pads 527 can be enhanced. Moreover, due to the design of the openings 532 with relatively small dimensions and high density, correspondingly, the circuits, connecting with the conductive pads 527, of the second interconnection scheme can be formed small. As a result, the parasitic capacitance generated by the second interconnection scheme can become relatively small.

Next, a second dielectric sub-layer 541 is formed on the passivation layer 530 by, for example, a spin-coating process, wherein the second dielectric sub-layer 541 is made of, for instance, photosensitive organic material. Subsequently, one or more via metal openings 543 are formed through the second dielectric sub-layer 541 using, for example, a photolithography process. The via metal openings 543 expose the conductive pads 527. In case that the width of the openings 532 is very small, such as 1 micron, the width of the via metal openings 543 can be designed to be larger than that of the openings 532. This leads conductive metals, during the following metal-filling process, to be easily filled into the via metal openings 543 and the openings 532. For instance, the width of the via metal openings 543 is 3 microns or larger than 3 microns.

Figure 10:
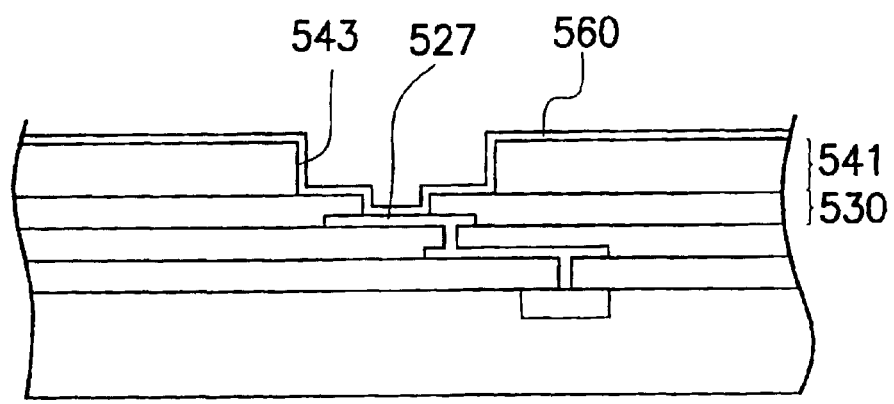
Figure 11:
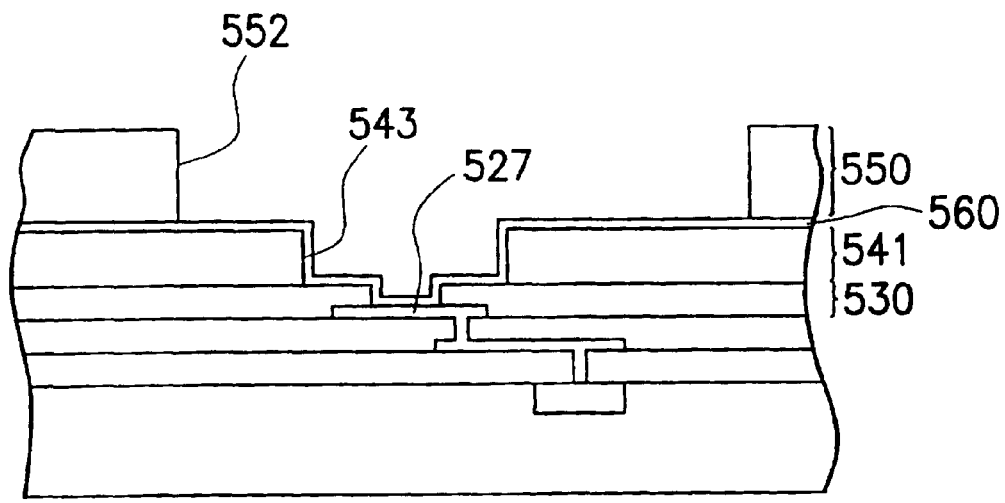
Figure 12:
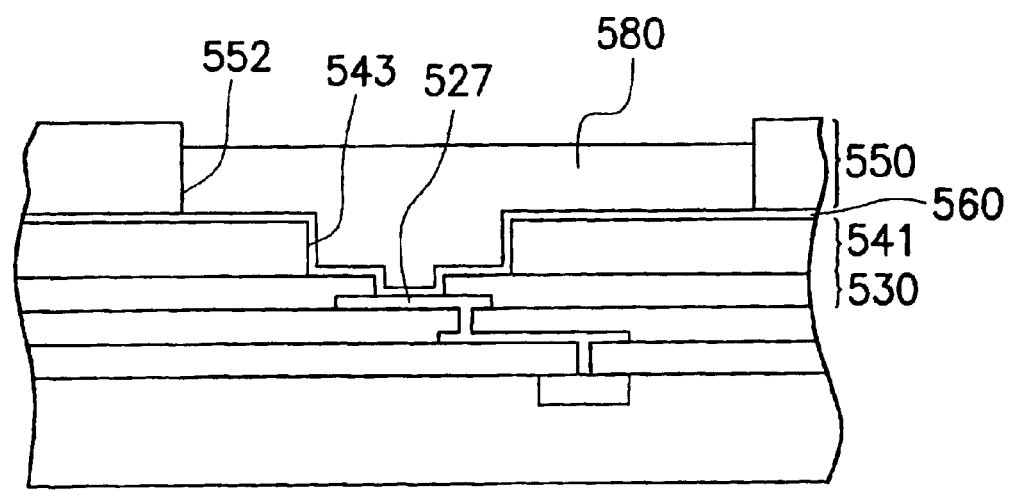
Figure 13:
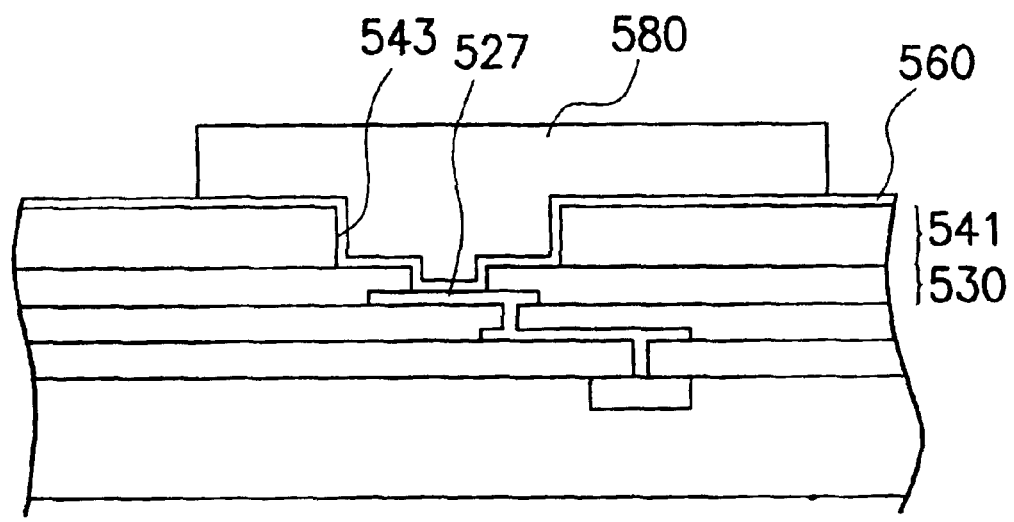

Next, referring to FIG. 10, by, for example, a sputtering process, a conductive layer 560 is formed onto the second dielectric sub-layer 541, onto the side walls of the via metal openings 543, and onto the passivation layer 530 and the conductive pads 527 exposed by the via metal openings 543. The conductive layer 560 is made of, for example, titanium-tungsten, titanium or chromium. Subsequently, as shown in FIG. 11, a photoresist 550 is formed onto the conductive layer 560. Then, by, for example, an exposing process and a lithography process, photoresist openings are formed where a second metal layer is demanded to be fabricated and pass through the photoresist 550 to expose the conductive layer 560. Subsequently, by, for example, an electroplating process, one or more conductive metals 580 are filled into the via metal openings 543 and the photoresist openings 552 as shown in FIG. 12, and are formed over the conductive layer 560. Foe example, the conductive metals 580 include copper, gold, or nickel. Thereafter, the photoresist 550 is removed as shown in FIG. 13.

Figure 14:
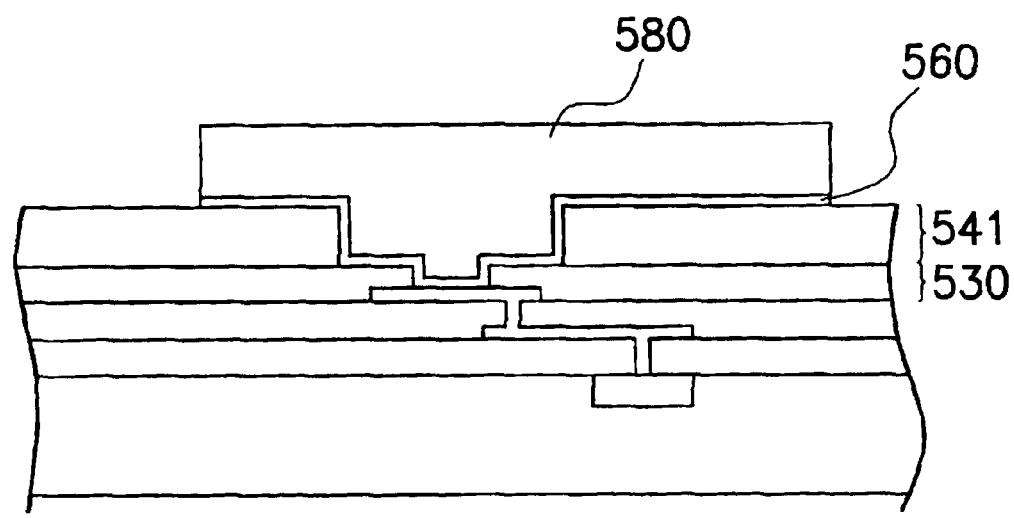
Figure 15:
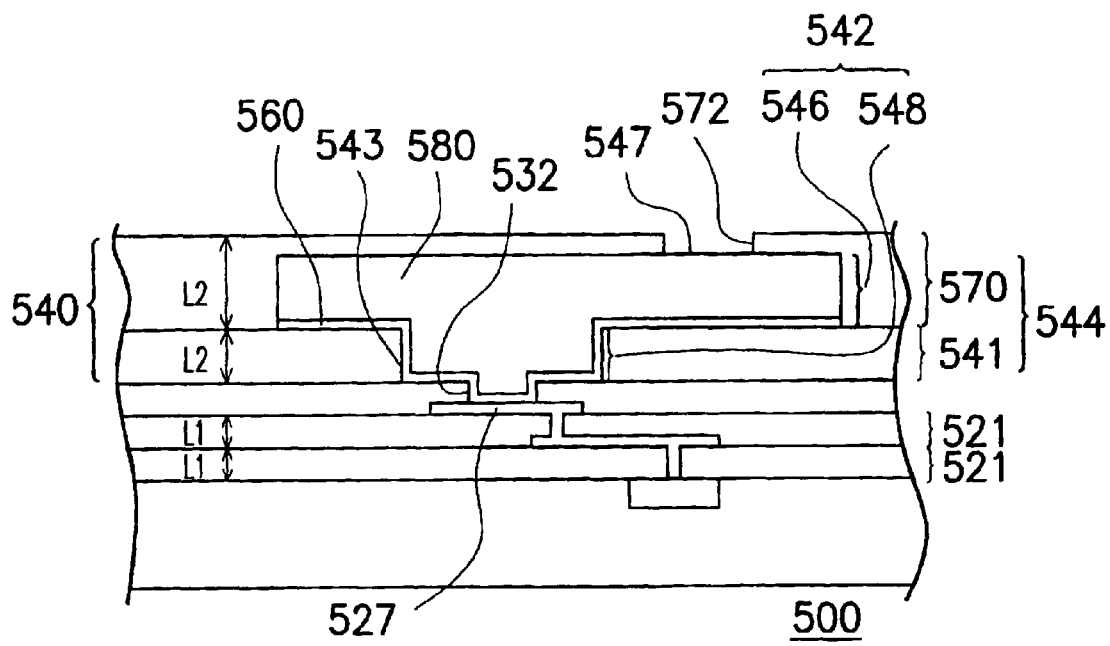

Following, referring to FIG. 14, the conductive layer 560 exposed to the outside is removed and only remains the conductive layer 560 disposed under the conductive metals 580. Next, referring to FIG. 15, by, for example, a spin-coating process, another second dielectric sub-layer 570 is formed onto the conductive metals 580 and onto the second dielectric sub-layer 541 located at the lower portion. The second dielectric sub-layer 570, latest formed at the higher portion, is made of, for example, photosensitive material. Subsequently, by, for example, a photolithography process, one or more node openings 572 are formed through the second dielectric sub-layer 570 located at the higher portion such that the node openings 572 expose the top conductive metal 580. The exposed conductive metal 580 is defined as nodes 547, through which the chip structure 500 can be electrically connected with external circuits. The second built-up layer 540 is completed so far. The second built-up layer 540 includes a second interconnection scheme 542 and a second dielectric body 544, wherein the second interconnection scheme 542 interlaces inside the second dielectric body 544. The second interconnection scheme 542 includes at least one second metal layer 546 and at least one via metal filler 548. The via metal filler 548 is constructed from the conductive metals 580 and the conductive layer 560 that are disposed in the via metal opening 543. The second metal layer 546 is constructed from the conductive metals 580 and the conductive layer 560 that are outside the via metal opening 543 and on the second dielectric sub-layer 541. The via metal filler 548 electrically connects the second metal layers 546 with the conductive pads 527. When the cross-sectional area of the opening 532 is very small, the cross-sectional area of the via metal opening 543 can be designed to be larger than that of the opening 532. The second dielectric body 544 is constructed from the lamination of the second dielectric multi-layers 541, 570. The thickness L2 of the second dielectric layers 541, 570 is extremely larger than the thickness L1 of the first dielectric layers 521. The thickness L2 of the second dielectric layers 541, 570 ranges from 1 micron to 100 microns. The structure, material, and dimension of the second built-up layer 540 are detailed in the previous embodiments, and the repeat is omitted herein.

Besides, the chip structure of the present invention can also be performed by the other process, described as follows. FIGS. 16–22 are various cross-sectional views schematically showing a process of fabricating a chip structure according to another embodiment of the present invention.

Figure 16:
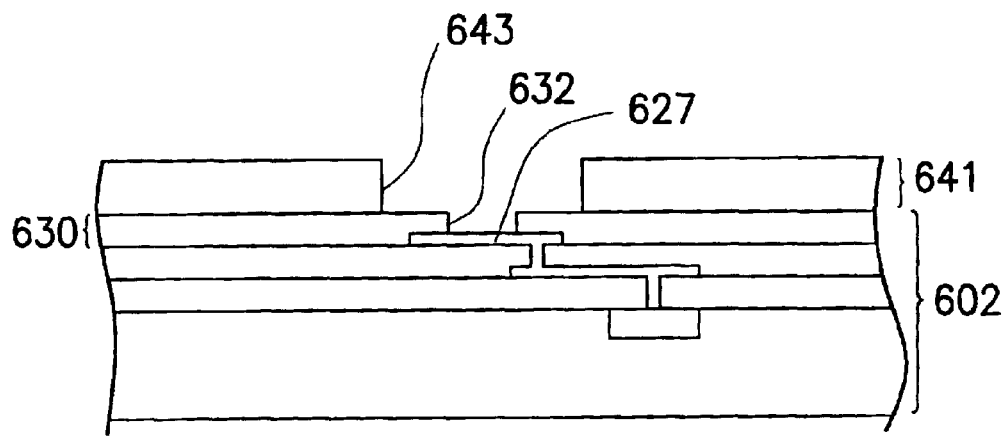
FIGS. 16–22 are various cross-sectional views schematically showing a process of fabricating a chip structure according to another embodiment of the present invention.

First, referring to FIG. 16, a wafer 602 is provided. The internal structure of the wafer 602 is detailed as the previous embodiments, and the repeat is omitted herein. Next, a second dielectric sub-layer 641 is formed onto the passivation layer 630 of the wafer 602 by, for example, a spin-coating process, wherein the second dielectric sub-layer 641 is made of, for instance, photosensitive material. Subsequently, one or more via metal openings 643 are formed through the second dielectric sub-layer 641 by, for example, a photolithography process. The via metal openings 643 expose the conductive pads 627. In case that the width of the openings 632 is very small, the width of the via metal openings 643 can be designed to be larger than that of the openings 632. This leads conductive metals, during the following metal-filling process, to be easily filled into the via metal openings 643 and the openings 632.

Figure 17:
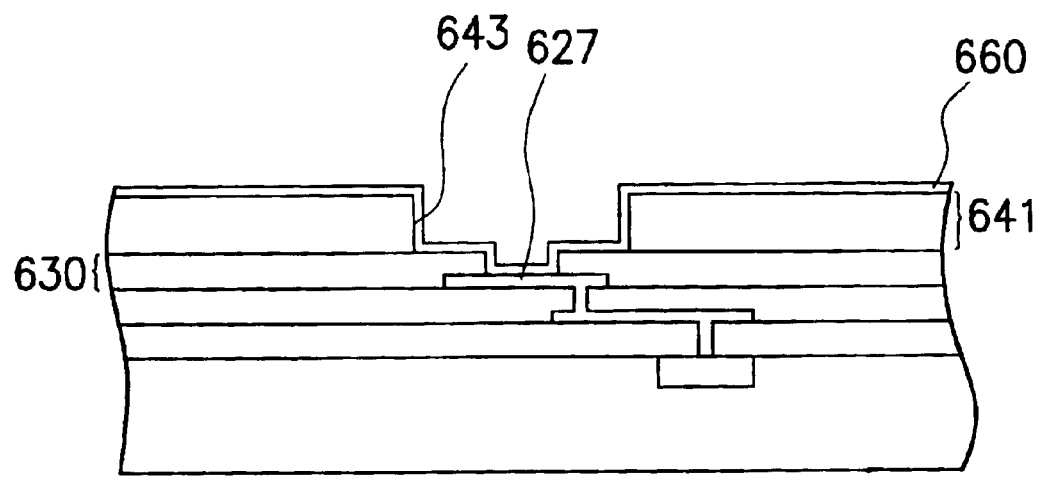

Subsequently, referring to FIG. 17, by, for example, a sputtering process, a conductive layer 660 is formed onto the second dielectric sub-layer 641, onto the side walls of the via metal openings 643, and onto the passivation layer 630 and the conductive pads 627 exposed by the via metal openings 643. The conductive layer 660 is made of, for example, titanium-tungsten, titanium or chromium.

Figure 18:
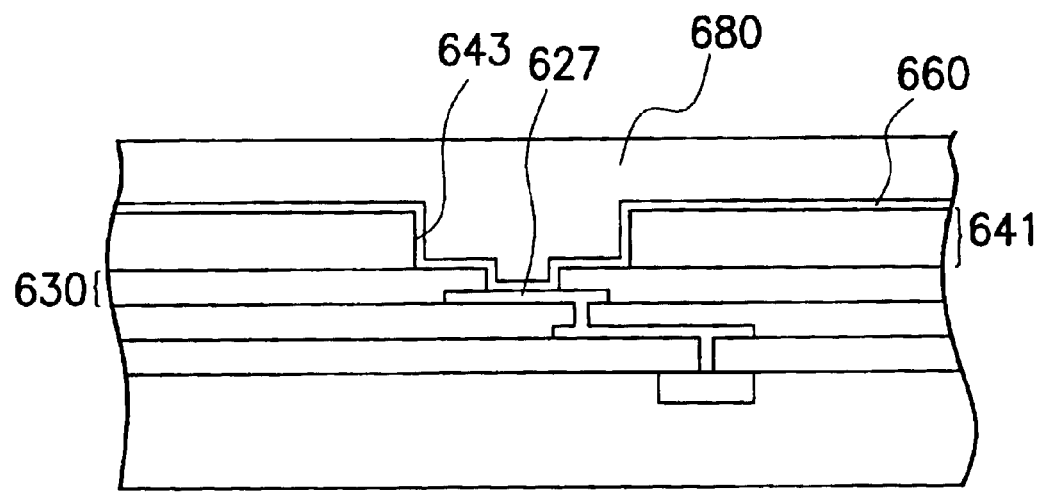
Figure 19:
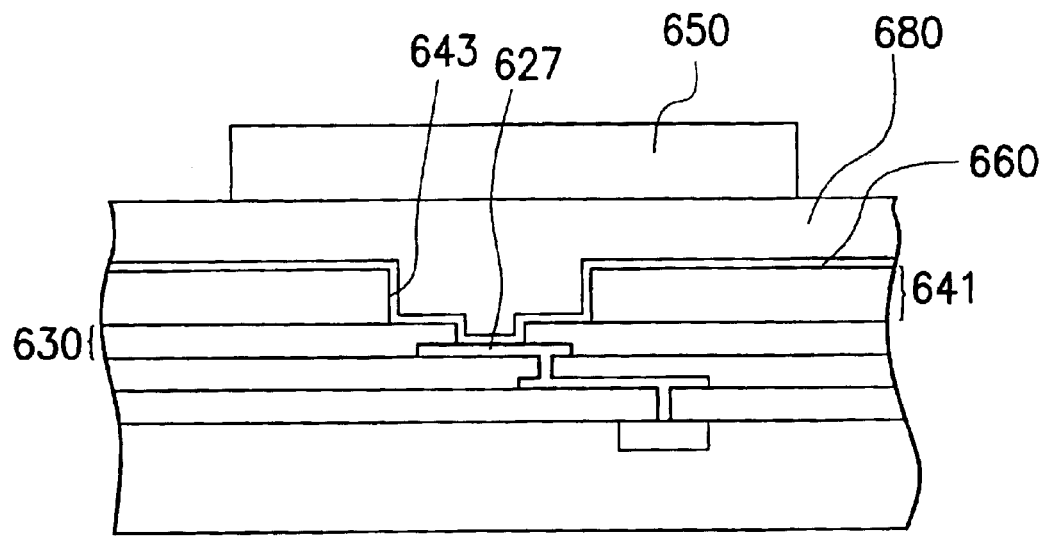
Figure 20:
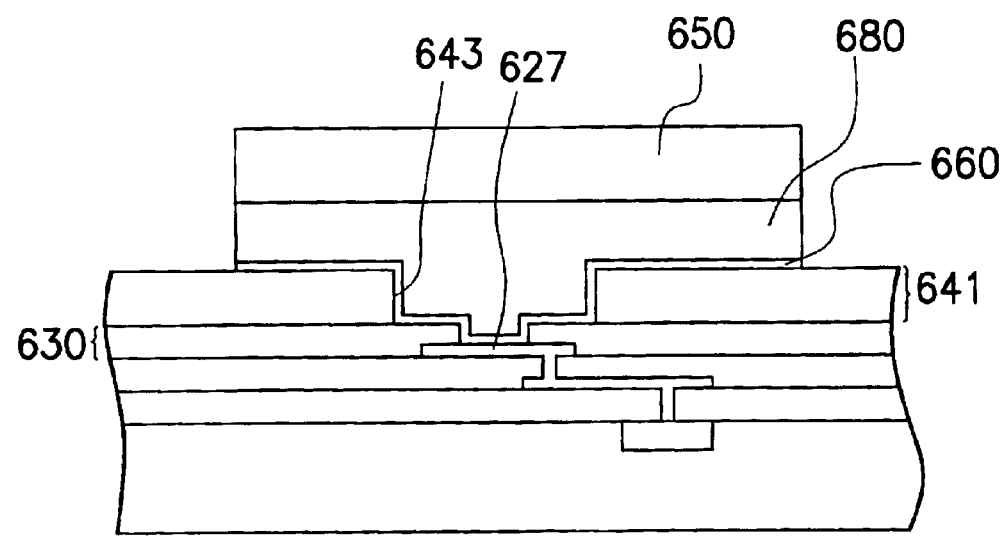
Figure 21:
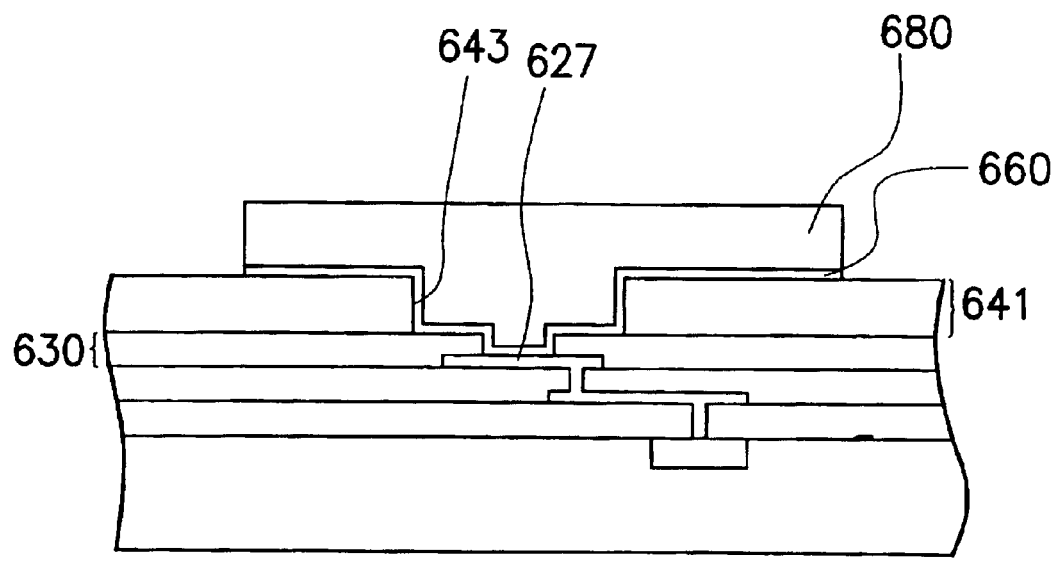

Following, referring to FIG. 18, one or more conductive metals 680 are formed onto the conductive layer 660 and into the via metal openings 643, by, for example, an electroplating process or a sputtering process. Foe example, the conductive metals 680 include copper, aluminum, gold, or nickel. Thereafter, referring to FIG. 19, a photoresist 650 is formed onto the conductive metals 680 and then by, for example, an exposure process and a lithography process, the photoresist 650 is defined with a line pattern. Only remains the photoresist 650 where a second metal layer is demanded to be formed, and the conductive metals 680 that is not demanded to be formed as the second metal layer is exposed to the outside. Subsequently, referring to FIG. 20, by, for example, an etching process, the conductive metals 680 exposed outside the photoresist 650 are removed. Thereafter, the conductive layer 660 exposed outside the conductive metals 680 are removed by, for example, another etching process. Next, the photoresist 650 is removed, as shown in FIG. 21.

Figure 22:
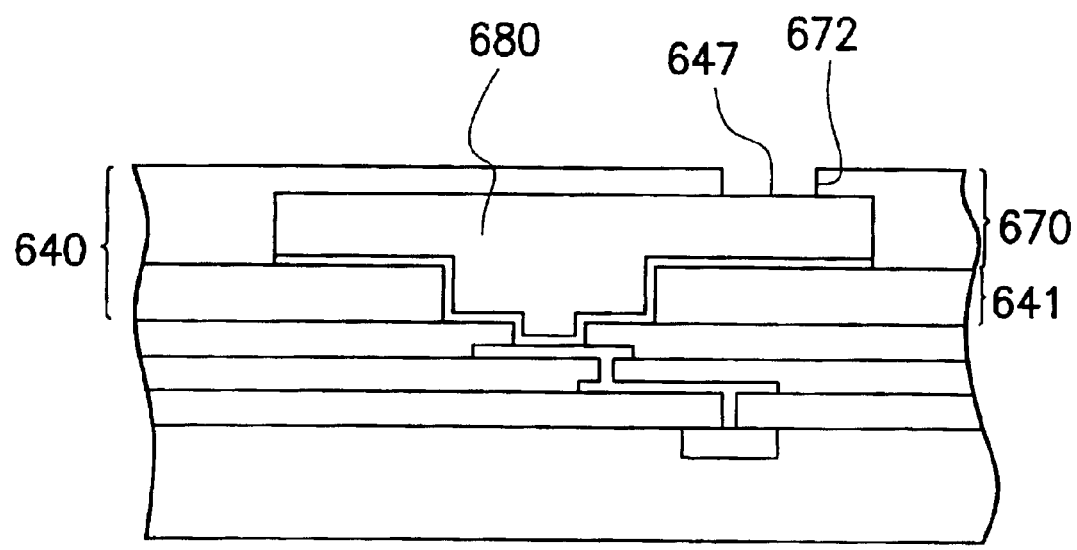

Next, referring to FIG. 22, by, for example, a spin-coating process, another second dielectric sub-layer 670 is formed onto the conductive metals 680 and onto the second dielectric sub-layer 641 located at the lower portion. The second dielectric sub-layer 670, latest formed at the higher portion, is made of, for example, photosensitive material. Subsequently, by, for example, a photolithography process, one or more node openings 672 are formed through the second dielectric sub-layer 670 located at the higher portion such that the node openings 672 expose the top conductive metal 680. The exposed conductive metal 680 is defined as nodes 647, through which the chip structure 600 can be electrically connected with external circuits. The structure, material, and dimension of the second built-up layer 640 are detailed in the previous embodiments, and the repeat is omitted herein.

In addition, according to the above process, the present invention is not limited to the application of the second metal layer with a signal layer. However, second metal multi-layers also can be applied in the present invention. The fabrication method of the second metal multi-layers is to repeat the above fabrication method of the second metal layer with a single layer. The second built-up layer, with second metal multi-layers, fabricated by the above whatever process is finally formed with a second dielectric sub-layer having node openings that expose the second interconnection scheme to be electrically connected with external circuits. Alternatively, the whole surface of the second metal layer at the top portion can be exposed to the outside, and through bumps or conducting wires, the second metal layer can be electrically connected with external circuits. Besides, when the second metal layers is over 2 layers, the via metal openings of the second dielectric sub-layer at a higher portion expose the second metal layer at a lower portion so that the conductive metals disposited in the via metal openings electrically connect the upper second metal layer with the lower second metal layer.

To sum up, the present invention has the following advantages:

1. The chip structure of the present invention can decline the resistance-capacitance delay, the power of the chip, and the temperature generated by the driving chip since the cross sectional area, the width and the thickness of the traces of the second metal layer are extremely large, since the cross sectional area of the via metal filler is also extremely large, since the second interconnection scheme can be made of low-resistance material, such as copper or gold, since the thickness of the individual second dielectric layer is also extremely large, and since the second dielectric body can be made of organic material, the dielectric constant of which is very low, approximately between 1~3, the practical value depending on the applied organic material.

2. According to the chip structure of the present invention, each of the power buses or the ground buses can electrically connect with more electric devices than that of prior art. Consequently, the number of the power buses or the ground buses can be reduced and, also, the number of the electrostatic discharge circuits accompanying the power buses or the ground buses can be reduced. In addition, the number of the nodes accompanying the power buses or the ground buses can be reduced. Thus, the circuit layout can be simplified and the production cost of the chip structure can be saved. The electrostatic discharge circuits can prevent the electric devices electrically connected with the second interconnection scheme from being damaged by the sudden discharge of high voltage.

3. The chip structure of the present invention can simplify a design of a substrate board due to the node layout redistribution, fitting the design of the substrate board, of the chip structure by the second interconnection scheme and, besides, the application of the fewer nodes to which ground voltage or power voltage is applied. Moreover, in case the node layout redistribution of various chips by the second interconnection scheme causes the above various chips to be provided with the same node layout, the node layout, matching the same node layout of the above various chips, of the substrate board can be standardized. Therefore, the cost of fabricating the substrate board substantially drops off.

4. According to the chip structure of the present invention, the second interconnection scheme can be produced using facilities with low accuracy. Therefore, production costs of the chip structure can substantially be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. The process for fabricating a chip structure, comprising:

Step 1: providing a wafer with a plurality of electric devices, an interconnection scheme and a passivation layer, both the electric devices and the interconnection scheme arranged inside the wafer, the interconnection scheme electrically connected with the electric devices, the passivation layer disposed on a surface layer of the wafer, the passivation layer having at least one opening exposing the interconnection scheme;

Step 2: forming a conductive layer over the passivation layer of the wafer and the conductive layer electrically connected with the interconnection scheme;

Step 3: forming a photoresist onto the conductive layer, and the photoresist having at least one opening exposing the conductive layer;

Step 4: filling at least one conductive metal over the conductive layer;

Step 5: removing the photoresist; and

Step 6: removing the conductive layer not covered with the conductive metal, wherein a signal is transmitted from one of the electric devices to the interconnection scheme, then passes through the passivation layer, and finally is transmitted to the conductive metal, and further, the signal is transmitted from the conductive metal to the interconnection scheme with passing through the passivation layer, and finally is transmitted to the other one or more of the electric devices.

2. The process according to claim 1, wherein a dielectric sub-layer is formed over the passivation layer and covers the formed conductive metal after step 6 is performed.

3. The process according to claim 2, wherein at least one node opening is formed through the dielectric sub-layer to expose the conductive metal formed at a lower portion after the dielectric sub-layer is formed over the passivation layer.

4. The process according to claim 2, wherein the dielectric sub-layer is made of an organic compound.

5. The process according to claim 2, wherein the dielectric sub-layer is made of a macromolecule polymer.

6. The process according to claim 2, wherein the dielectric sub-layer is made of polyimide (PI), benzocyclobutene (BCH), porous dielectric material, parylene, or elastomer.

7. The process according to claim 1, wherein the process further comprises:

Step 7: forming a dielectric sub-layer over the passivation layer, the dielectric sub-layer covering the formed conductive metal, and the dielectric sub-layer having at least one opening exposing the conductive metal formed at a lower portion;

Step 8: forming at least other one conductive layer on the dielectric sub-layer and into the opening of the dielectric sub-layer, and the other conductive layer electrically connected with the metal layer exposed by the opening of the dielectric sub-layer;

Step 9: forming a photoresist onto the other conductive layer, and the photoresist having at least one opening exposing the other conductive layer;

Step 10: filling other at least one conductive metal into the opening of the photoresist, and the other conductive metal disposed over the other conductive layer;

Step 11: removing the photoresist; and

Step 12: removing the other conductive layer not covered with the other conductive metal.

8. The process according to claim 7, wherein the dielectric sub-layer is made of an organic compound.

9. The process according to claim 7, wherein the dielectric sub-layer is made of a macromolecule polymer.

10. The process according to claim 7, wherein the dielectric sub-layer is made of polyimide (PI), benzocyclobutene (BCB), porous dielectric material, parylene, or elastomer.

11. The process according to claim 7, wherein the thickness of the dielectric sub-layer ranges from 1 micron to 100 microns.

12. The process according to claim 7, wherein at least other one dielectric sub-layer is formed over the passivation layer and covers the formed conductive metal after the step 12 is performed.

13. The process according to claim 12, wherein at least one node opening is formed through the other dielectric sub-layer to expose the conductive metal formed at a lower portion after the other dielectric sub-layer is formed over the passivation layer and covers the formed conductive metal.

14. The process according to claim 12, wherein the further dielectric sub-layer is made of an organic compound.

15. The process according to claim 12, wherein the other dielectric sub-layer is made of a macromolecule polymer.

16. The process according to claim 12, wherein the other dielectric sub-layer is made of polyimide (PI), benzocyclobutene (BCB), porous dielectric material, parylene, or elastomer.

17. The process according to claim 7, wherein the sequential steps 7–12 are repeated at least one time.

18. The process according to claim 17, wherein at least other one dielectric sub-layer is formed over the passivation layer and covers the formed conductive metal after the sequential steps 7–12 are repeated at least one time.

19. The process according to claim 18, wherein at least one node opening is formed through the other dielectric sub-layer to expose the conductive metal formed at a lower portion after the other dielectric sub-layer is formed over the passivation layer and covers the formed conductive metal.

20. The process according to claim 18, wherein the other dielectric sub-layer is made of an organic compound.

21. The process according to claim 18, wherein the other dielectric sub-layer is made of a macromolecule polymer.

22. The process according to claim 18, wherein the other dielectric sub-layer is made of polyimide (PI), benzocyclobutene (BCB), porous dielectric material, parylene, or elastomer.

23. The process according to claim 1, wherein the thickness of the trace constructed of the conductive layer and the conductive metal ranges from 1 micron to 50 microns.

24. The process according to claim 1, wherein the width of the trace constructed of the conductive layer and the conductive metal ranges from 1 micron to 1 centimeter.

25. The process according to claim 1, wherein the cross-sectional area of the trace constructed of the conductive layer and the conductive metal ranges from 1 square micron to 0.5 square millimeters.

26. The process according to claim 1, wherein the passivation layer is constructed of an inorganic compound.

27. The process according to claim 1, wherein the passivation layer is constructed of a silicon oxide compound, a silicon nitride compound, phosphosilicate glass (PSG), a silicon oxide nitride compound or a composite formed by laminating the above material.

28. The process according to claim 1, wherein, before the step 2 is performed, a dielectric sub-layer is formed on the passivation layer, the dielectric sub-layer includes at least one via metal opening connecting with the opening of the passivation layer, and, then, when the step 2 is performed, the conductive layer is formed on the dielectric sub-layer, the side wall of the via metal opening, and the interconnection scheme exposed by the opening of the passivation layer.

29. The process according to claim 28, wherein the largest width of the via metal opening is larger than that of the opening of the passivation.

30. The process according to claim 28, wherein the cross-sectional area of the via metal opening ranges from 1 square micron to 10,000 square microns.

31. The process according to claim 28, wherein the largest width of the opening of the passivation ranges from 0.5 microns to 200 microns.

32. The process according to claim 1, wherein during the step 2, a sputtering process is used to form the conductive layer over the passivation layer of the wafer.

33. The process according to claim 1, wherein during the step 4, an electroplating process is used to fill the conductive metal over the conductive layer.

34. The process according to claim 1, wherein the material of the conductive layer includes titanium-tungsten alloy, titanium or chromium.

35. The process according to claim 1, wherein the material of the conductive metal includes copper, nickel, or gold.

* * * * *